(12) United States Patent
Oakes et al.

(10) Patent No.: US 8,064,188 B2
(45) Date of Patent: Nov. 22, 2011

(54) OPTIMIZED THIN FILM CAPACITORS

(75) Inventors: James Oakes, Sudbury, MA (US);
James Martin, Londonderry, NH (US)

(73) Assignee: Paratek Microwave, Inc., Nashua, NH (US)

( * ) Notice: Subject to any disclaimer, the term of this patent is extended or adjusted under 35 U.S.C. 154(b) by 320 days.

(21) Appl. No.: 11/602,114

(22) Filed: Nov. 20, 2006

(65) Prior Publication Data
US 2007/0152773 A1    Jul. 5, 2007

Related U.S. Application Data

(60) Continuation-in-part of application No. 10/938,898, filed on Sep. 10, 2004, now abandoned, which is a continuation of application No. 10/455,901, filed on Jun. 6, 2003, now Pat. No. 6,864,757, which is a division of application No. 09/909,187, filed on Jul. 19, 2001, now Pat. No. 6,590,468.

(60) Provisional application No. 60/219,500, filed on Jul. 20, 2000.

(51) Int. Cl.
*H01G 4/005* (2006.01)
*H01G 4/228* (2006.01)

(52) U.S. Cl. ............... 361/303; 361/330; 361/306.1

(58) Field of Classification Search .......... 361/303, 361/304–305, 330, 306.1
See application file for complete search history.

(56) References Cited

U.S. PATENT DOCUMENTS

| | | | |
|---|---|---|---|
| 6,172,385 B1 | 1/2001 | Duncombe et al. | 257/295 |
| 6,452,776 B1 * | 9/2002 | Chakravorty | 361/303 |
| 6,461,930 B2 | 10/2002 | Akram | 438/396 |
| 6,661,638 B2 * | 12/2003 | Jackson et al. | 361/303 |
| 6,670,256 B2 | 12/2003 | Yang et al. | 438/396 |
| 6,724,611 B1 * | 4/2004 | Mosley | 361/306.3 |
| 6,888,714 B2 * | 5/2005 | Shaw et al. | 361/301.2 |
| 6,943,078 B1 | 9/2005 | Zheng et al. | 438/238 |
| 6,949,442 B2 | 9/2005 | Chiu et al. | 438/396 |
| 6,964,296 B2 | 11/2005 | Memory et al. | 165/151 |
| 7,714,678 B2 | 5/2010 | du Toit et al. | |
| 7,728,693 B2 | 6/2010 | du Toit et al. | |
| 2003/0071300 A1 * | 4/2003 | Yashima et al. | 257/310 |
| 2005/0082636 A1 * | 4/2005 | Yashima et al. | 257/532 |

OTHER PUBLICATIONS

Ali Tombak, Tunable Barium Strontium Titanate Thin Film Capacitors for RF and Microwave Applications. IEEE Microwave and Wireles Components Letters, vol. 12, Jan. 2002.
T.R. Taylor et al., Impact of thermal strain on the dielectric constant of sputtered barium strontium titanate thin films. Applied Physics Letters, 2002 American Institute of Physics.
N.K. Pervez et al. High Tunability barium strontium titanate thin films for RF circuit applications. Applied Physics Letters, 2004 American Institute of Physics.
S. Hyun et al. Effects of strain on the dielectric properties of tunable dielectric SrTiO3 thin films. Applied Physics Letters, 2004 American Institute of Physics.
Hongtao Xu et al. Tunable Microwave Integrated Circuits using BST Thin Film Capacitors with Device Structure Optimization. Integrated Ferroelectrics, Department of Electrical Engineering and Computer Engineering, University of California, 2005.

* cited by examiner

*Primary Examiner* — Eric Thomas
(74) *Attorney, Agent, or Firm* — Guntin Meles & Gust, PLC; Andrew Gust

(57) ABSTRACT

At least an embodiment of the present technology provides a capacitor, comprising a substrate, a first solid electrode disposed on the substrate, a second electrode broken into subsections, the subsections connected by a bus line and separated from the first electric by a dielectric medium. The second electrode broken into subsections may have a lower resistance than the first solid electrode and by changing the width and length of the sides of the subsections, the resistance of the first electrode is modifiable.

20 Claims, 3 Drawing Sheets

OPTIMIZED THIN FILM CAPACITORS

CROSS REFERENCE TO RELATED APPLICATIONS

This application is a continuation in part of application Ser. No. 10/938,898 entitled "TUNABLE MICROWAVE DEVICES WITH AUTO-ADJUSTING MATCHING CIRCUIT" filed 10 Sep. 2004 now abandoned, which was a continuation of application Ser. No. 10/455,901 entitled "TUNABLE MICROWAVE DEVICES WITH AUTO-ADJUSTING MATCHING CIRCUIT" filed 6 Jun. 2003 now U.S. Pat. No. 6,864,757, which was a divisional of application Ser. No. 09/909,187 filed Jul. 19, 2001, now U.S. Pat. No. 6,590,468, entitled "TUNABLE MICROWAVE DEVICES WITH AUTO-ADJUSTING MATCHING CIRCUIT" which claimed the benefit of U.S. provisional application No. 60/219,500 filed Jul. 20, 2000.

BACKGROUND OF THE TECHNOLOGY

Wireless communications is a rapidly growing segment of the communications industry, with the potential to provide high-speed high-quality information exchange between portable devices located anywhere in the world. Potential applications enabled by this technology include multimedia internet-enabled cell phones, smart homes, appliances, automated highway systems, distance learning, and autonomous sensor networks, just to name a few. Supporting these applications using wireless techniques poses significant technical challenge. As handsets move to meet broadband, the requirements of components are more astringent. Electrical communication systems demand new more efficient low loss devices that can be used at higher frequency ranges.

Recent advances in tunable ferroelectric materials have allowed for relatively low capacitance varactors that can operate at temperatures above those necessary for superconduction and at bias voltages less than those required for existing planar varactor structures, while maintaining high tenability and high Q factors. Even though these materials work in their paraelectric phase above the Curie temperature, they are conveniently called "ferroelectric" because they exhibit spontaneous polarization at temperatures below the Curie temperature. Tunable ferroelectric materials including barium-strontium titanate $Ba_xSr_{1-x}TiO_3$ (BST) or BST composites have been the subject of several patents. Dielectric materials including BST are disclosed by Sengupta, et al. in U.S. Pat. No. 5,312,790; U.S. Pat. No. 5,427,988; U.S. Pat. No. 5,486,491; U.S. Pat. No. 5,846,893; U.S. Pat. No. 5,635,434; U.S. Pat. No. 5,830,591; U.S. Pat. No. 5,766,697; U.S. Pat. No. 5,693,429; U.S. Pat. No. 6,074,971; U.S. Pat. No. 6,801,104 B2 and U.S. Pat. No. 5,635,433. These patents are hereby incorporated by reference. The permittivity (more commonly called dielectric constant) of these materials can be varied by varying the strength of an electric field to which the materials are subjected. These materials allow for thin-film ferroelectric composites of low overall dielectric constant that takes advantage of the high tunability and at the same time having high dielectric constants.

BST thin films have been used in microwave circuit applications because of their high dielectric constant, high tunability, low loss, and fast switching speed. Tunable BST films have been demonstrated as an attractive technology to low cost agile mobile circuits, such as tunable filters, tunable matching networks at a high tunable frequency range. Most of these technologies have focused on material quality, choice of electrodes, and deposition or processing techniques. As the technology matures, several issues have arisen due to the deposition methods and limited choice of electrode materials available due to the extreme deposition temperatures. Quality factor, resonance frequency and breakdown voltage are important factors for determining which applications BST thin films will work best in. High-frequency device losses consist of material-related losses in the film and at the electrode-film interface, as well as the resistive losses in the electrodes. First, thermal strain on the interface between the ferroelectric thinfilm and the metal electrode due to the creation of oxide films and crystalline microstructure. This interface is generally the cause of losses at high frequencies and premature breakdown at low voltages. Second, the designs on current devices are limited by traditional design guidelines that create resistive losses due to design constraints.

There is a need in the industry to improve the efficiency of BST thinfilm capacitors by design implementation. There is a further need to create a BST thinfilm design structure that minimizes loss at the dielectric-electrode interface. There is also a further need to create BST thinfilm designs that presents and improved structure where there is minimum contact with the bottom electrodes and creates an optimized periphery with a superb quality (Q) factor and a reasonable aspect ratio range.

BRIEF SUMMARY OF THE TECHNOLOGY

At least an embodiment of the present technology provides a capacitor, comprising a substrate, a first solid electrode disposed on the substrate, a second electrode broken into subsections, the subsections connected by a bus line and separated from the first electric by a dielectric medium. The second electrode broken into subsections may have a lower resistance than the first solid electrode and by changing the width and length of the sides of the subsections, the resistance of the first electrode is modifiable.

The present technology further provides a BST thinfilm design structure that by varying the Width/Length aspect ratio it optimizes electrode structure that allows for the creation of very high "Q" (low resistance) capacitors. The design structure relates to common capacitor material structures wherein one electrode is made from a higher resistance metal than the opposite electrode. Capacitors with such material properties can be found in planar integrated capacitors, as well as discrete ceramic capacitors. The inventive structure also reduces the mechanical stresses generated in the metals and dielectric films of the capacitor.

BRIEF DESCRIPTION OF THE SEVERAL VIEWS OF THE DRAWINGS

The foregoing summary, as well as the following detailed description of the technology, will be better understood when read in conjunction with the appended drawings. For the purpose of illustrating the technology, there are shown in the embodiments which are presently preferred. It should be understood, however, that the technology is not limited to the precise arrangements and instrumentalities shown. In the drawings.

DESCRIPTION OF THE TECHNOLOGY

Figure 1:
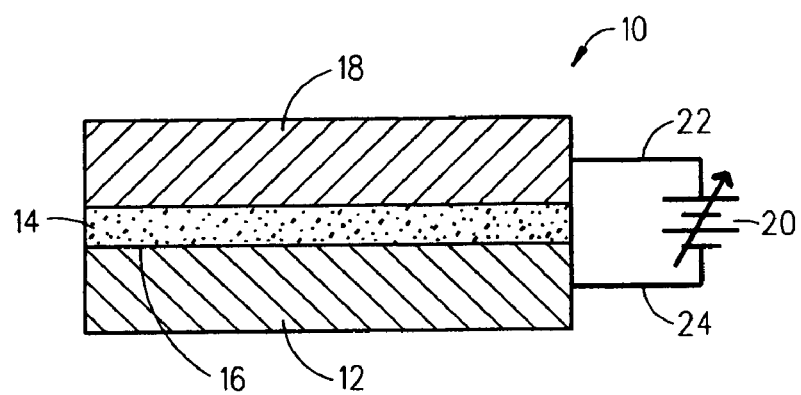
FIG. 1 depicts a prior art structure where the BST dielectric material is sandwiched between a top and a bottom electrode.

FIG. 1 depicts a prior art structure where the BST dielectric material 14 is sandwiched between a top 18 and a bottom electrode 12. The FIG. 1 structure shows a typical capacitor design. The structure is most appropriate when used at the low end of the radio frequency spectrum. This conventional integrated parallel-plate overlay capacitor structure of FIG. 2 where the bottom electrode 204A thickness is constrained by the BST film thickness 203. The losses in the thin bottom electrodes 204A limit the overall high frequency quality factor of the BST capacitors. Additionally, the higher electrical field between the top 201 and bottom electrodes 204A at the edge of the cross-over 205 creates premature breakdown under the application of high bias voltages or large ac signals to the BST capacitor. As the frequency increases, electromagnetic waves travel towards the surface of the circuits, making the surface properties, deposition techniques and design critical. As the surface wave velocity propagates throughout the surface of the capacitor, the waves are slowed due to the field shortening effect. The degree of the effect is typically dependent on the geometry and pattern of the top metallization.

Figure 2:
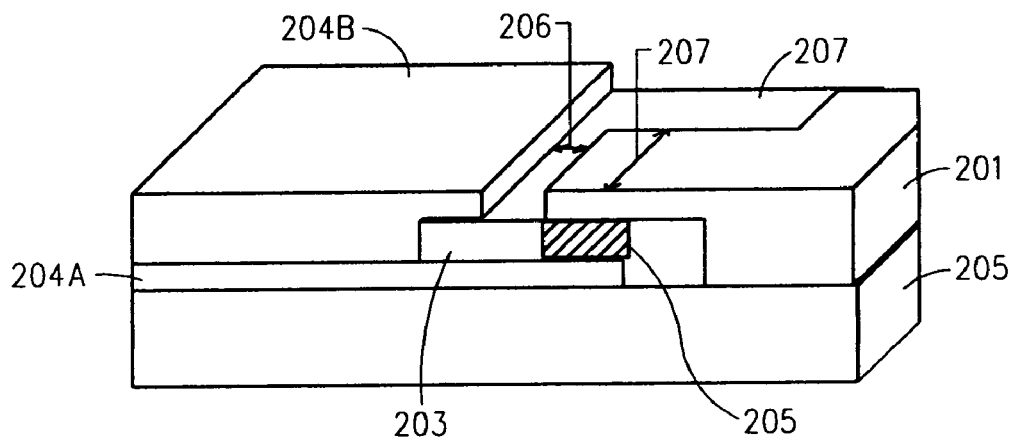
FIG. 2 depicts an embodiment of the prior art technology in 3D, where it contains a stack of a thinfilm deposited electrode terminals and BST materials on top of a substrate.
Figure 3:
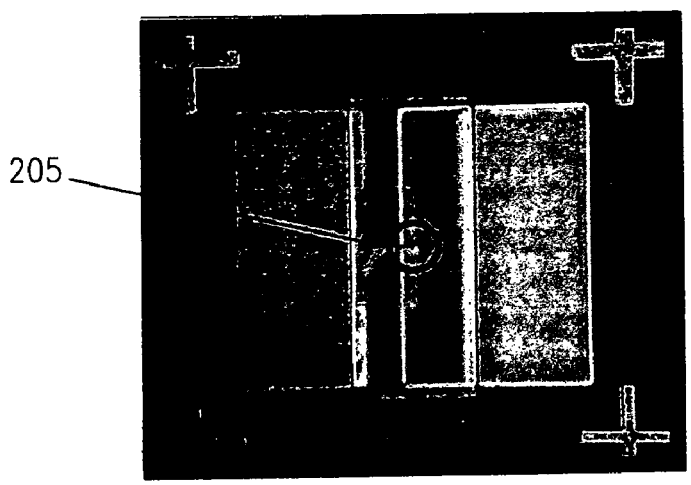
FIG. 3 depicts a micro-image close-up of the top of two series capacitors as described in FIG. 2.

FIG. 3 depicts a typical tuning capacitor fabricated with BST materials. These micrographs shows the dimension of a standard 0603 surface mount package and the size of active area 205 of the capacitor is just 150 micrometers square. A 0201 surface mount package would be 250 micrometers by 500 micrometers and a wire bonded package using this technology would be as small as 60 micrometers by 60 micrometers. As depicted in FIG. 2, a first bottom electrode, such as Platinum 204A is patterned and deposited into the substrate. At least a thinfilm coating of a BST type material 203 is then deposited on top of the first electrode 204A. At least a second electrode 201 (which confines the active area) is deposited on top the BST film 203. It is the top electrode 201 that usually defines the capacitance of the device. At least one final interconnect (or bus) 204B is deposited over the thin film structure to provide attachment to the microwave circuit and at least an electrical path to the bottom Platinum electrode 204A. Usually, the top electrode 201 and the bus 204B are made of materials comprising sputtered or deposited Gold, Aluminum and Silver. Finally, at least a polymer encapsulation is deposited to provide protection from the ambient and as a humidity barrier. Although not preferred for high frequency applications, a person skilled in the art may deposit multiple layers of BST thinfilm and electrodes creating an elaborate 3D structure of multiple layers capacitor stack.

It shall be understood to the person skilled in the art that "high frequency" refers to the radio spectrum between 3 MHZ to 30 GHz, which includes both the "RF" spectrum and the "microwave spectrum". It shall be further understood that a "device" comprises multiple "components" both "passive components" and "active components" and a "3D" device may comprise multiple layers stacked vertically.

Creep is the term given to the material deformation that occurs as a result of long term exposure to levels of stress that are below the yield or ultimate strength. The rate of this damage is a function of the material properties, the exposure time, exposure temperature and the applied load (stress). Creep is usually experienced when the device is heated and cooled as a function of use or environmental temperature fluctuations. Such failures may be caused either by direct thermal loads or by electrical resistive loads, which in turn generate excessive localized thermal stresses. Depending on the magnitude of the applied stress and its duration, the deformation may become so large that it will experience brittle and/or ductile fracture, interfacial separation and creep rupture.

An embodiment of the inventive technology may comprise at least one electrode structure that allows for the creation of very high "Q" (low resistance) capacitors. The technology is particularly well suited to common capacitor material structures wherein at least one electrode is made from a higher resistance metal than the opposite electrode. High resistance electrodes comprise and are not limited to Tungsten, Platinum, Rhodium, Chrome, Titanium/Tungsten and Nickel composites. Examples of capacitors with such material properties can be found in planar integrated capacitors, as well as discrete ceramic capacitors. The inventive structure further reduces the mechanical stresses, creep and other thermal generated stresses in the metals and dielectric films of the capacitor. The broken electrode usually carries the lower resistance of the two. The broken electrode distributes the signal across the capacitor area and, through proper arrangement, increases the effective width of the signal path through the higher resistance solid electrode. The signal busses (electrical metal connections) bring in and take out the signal. The inventive technology comprises at least a broken electrode and bussing where the broken electrode can be used in all kinds of capacitors, and may find applicability in transistor structures.

Figure 4:
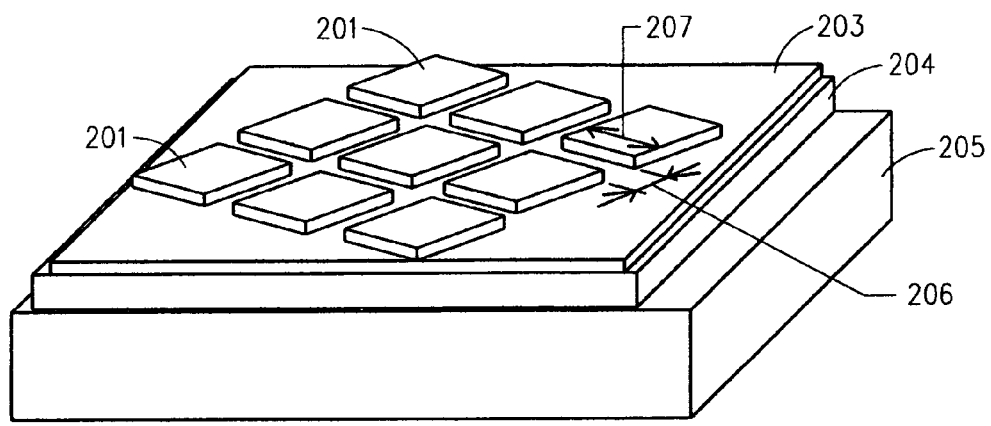
FIG. 4 depicts an embodiment of the inventive technology in 3D, where it contains a stack of a thinfilm diamond shaped deposited electrode terminals and BST materials on top of a substrate.
Figure 5:
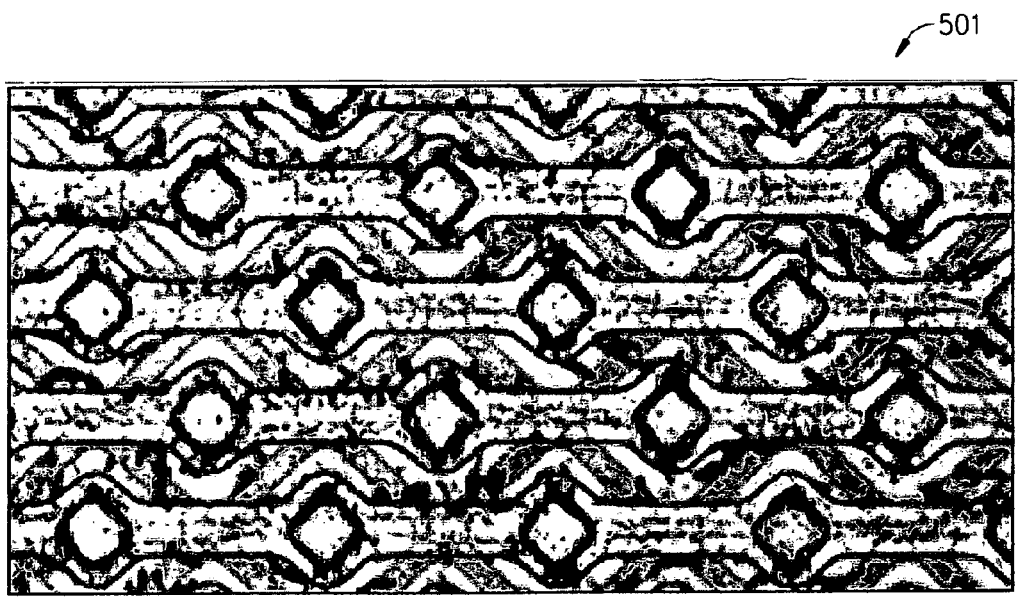
FIG. 5 depicts a micro-image close-up of the top of two series capacitors as described in FIG. 4.

The inventive structure realizes these benefits by breaking at least two of the electrodes of a pair of series capacitors into subsections. By varying the Width (W) 207 and Length (L) 206 aspect ratio of the aperture between the electrodes in the active area 205, an optimized Q value can be achieved. The sections are arranged in such that it increases the effective Width 207 of the signal path in the higher resistance electrode 204A. These subsections are then electrically connected through a bus 501 as seen in the micrograph of FIG. 5. In order to make a smaller more efficient capacitor reduction of the critical dimensions 206, 207 has to be maximized in order to increase the active area 205. The length (L) 206 dimension will usually be fixed because of lithographic constraints, therefore by modifying the (W) 207 dimension and duplicating the structure as seen in FIG. 4, the active area is significantly increased and the change in capacitance can be as high as 5 to 1. An embodiment of the present technology allows for the creation of a wide frequency of tuning, and some of the preferred applications include but are not limited to low loss phase shifters for high electronically scanning antennas.

The reduction in thermally induced creep occurs because the individual electrode subsections retain and create less stress than a single plate of similar area. Shear Stress is defined as the shear force per unit area applied to a section. The smaller the area of shear, the smaller the stress applied to the device. As illustrated in FIG. 4, the "diamond" configuration depicts one embodiment of the invention in which the reduction of the original breaking of the electrode increases the width to 4.25 times that of the conventional capacitor of FIG. 2 and FIG. 3. The reduction in resistance, leading to an increase in Q, occurs because the length 206 of the signal path stays the same while the effective width 207 increases. The bus 501 is not shown in FIG. 4 for clarity purposes. FIG. 4 depicts at least one preferred method of manufacture the inventive capacitor 3D stack. It comprises the steps of forming a multilayer BST composite by sputter blanket PARASCAN from Paratek Inc. (35 target) on top of a Gennum Inc. 0.2 um Pt substrate. A Gold (Au) top electrode is patterned using conventional semiconductor lithographic techniques and sputtered on top in order to create the interconnections between the top and bottom electrodes. The embodiment may also include at least one buffer layer. The wafer will be diced into approximate 4 of ½ by ½ after the PARASCAN deposition.

Figure 6:
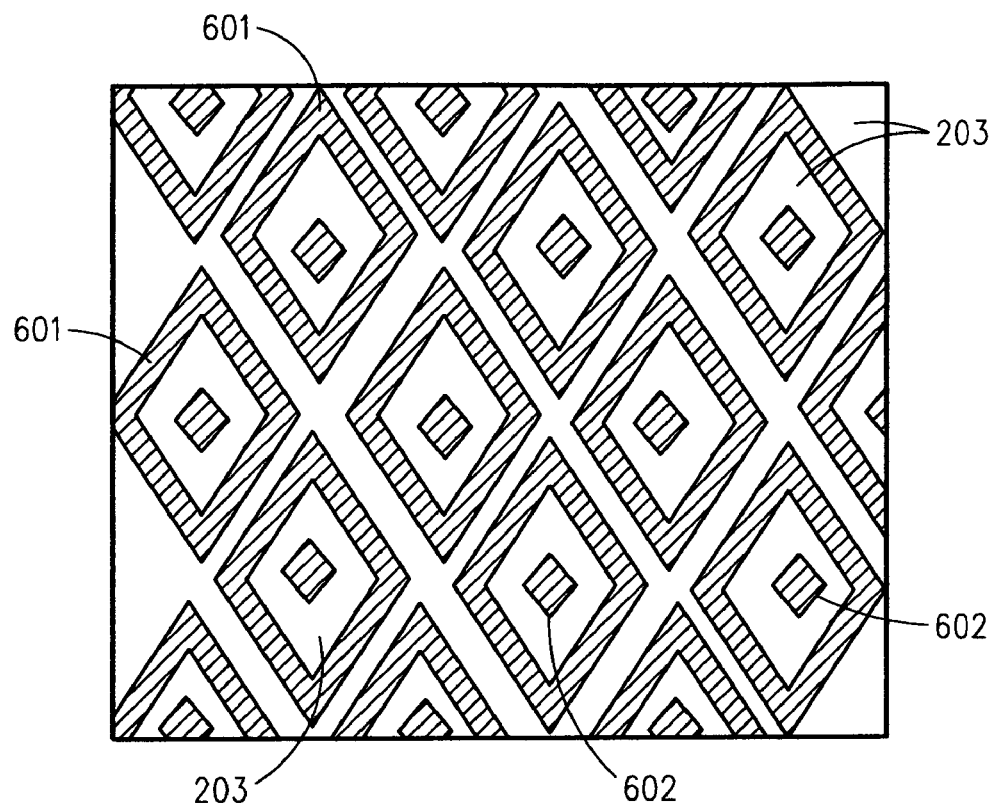
FIG. 6 depicts the top view of an embodiment of the inventive technology, said view depicts thinfilm diamond ring shaped electrode terminal with internal islands deposited terminals on top of BST materials and a substrate.
Figure 7:
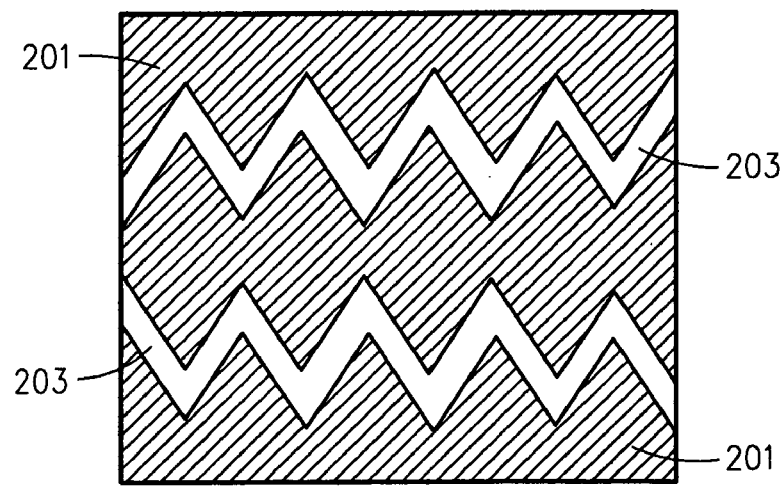
FIG. 7 depicts the top view of an embodiment of the inventive technology, where it depicts thinfilm terminals deposited to form a zigzag space on top of BST materials and a substrate.

A person skilled in the art may break the electrodes into many different shapes and arranged in many different ways to create the aforementioned benefit of this technology. FIG. 6 and FIG. 7 depict capacitors without the interconnection bus 501 for clarity. The bus 501 may be patterned and deposited by one skilled in the art in order to create parallel or series capacitors. Two embodiments of technology are shown FIG. 6 and FIG. 7. These embodiments include and at least a solid bottom electrode, the electrodes broken into subsections FIG. 6 which further depicts at least a "diamond ring" 601 with internal "islands" 602, this approach maximizes the (W) 207 on both sides of the top electrode, signal bus lines 501 to connect the subsections are not depicted for clarity but would connect the islands and rings to the outside circuitry for example trough gold wirebonds or studs.

It will be appreciated by those skilled in the art that changes could be made to the embodiments described above without departing from the broad inventive concept thereof. It is understood, therefore, that this technology is not limited to the particular embodiments disclosed, but it is intended to cover modifications within the spirit and scope of the present technology.

What is claimed is:

1. A capacitor, comprising:
a substrate;
a first solid electrode disposed on said substrate;
a second electrode broken into subsections, said subsections connected by a bus line and separated from said first electrode by a dielectric medium, wherein said subsections form polygonal, triangle, quadrilateral, or nonagon shapes with internal islands, wherein the polygonal, triangle, quadrilateral and nonagon shapes and the internal islands are connected to said bus line.

2. The capacitor of claim 1, wherein said second electrode broken into subsections has a lower resistance than said first solid electrode.

3. The capacitor of claim 1, wherein said electrode materials are selected from the group consisting of Tungsten, Platinum, Rhodium, Chrome, Titanium/Tungsten and Nickel composites.

4. The capacitor of claim 1, wherein materials for said dielectric medium are selected from the group consisting of tunable ferroelectric materials including barium-strontium titanate $Ba_xSr_{1-x}TiO_3$ (BST) and BST composites.

5. The capacitor of claim 1, wherein materials for said substrate are selected from the group consisting of Alumina ($Al_2O_3$), Aluminum Nitride (AlN), Titania ($TiO_2$), glass-ceramic composites.

6. The capacitor of claim 1, wherein said bus line is made from materials selected from the group consisting of gold, silver, copper, aluminum, platinum, chrome composites and nickel composites.

7. The capacitor structure of claim 1, wherein said subsections form diamond shapes with internal islands.

8. The capacitor of claim 1, wherein the bus line is connected with the polygonal, triangle, quadrilateral and nonagon shapes and the internal islands of the second electrode to form at least two capacitors in series.

9. The capacitor of claim 1, wherein the bus line is connected with the polygonal, triangle, quadrilateral and nonagon shapes and the internal islands of the second electrode to form capacitors in series without capacitors in parallel.

10. The capacitor of claim 1, wherein the subsections cover a substantial portion of the dielectric medium.

11. The capacitor of claim 1, wherein the first electrode is positioned directly on the substrate.

12. A capacitor, comprising:
a substrate;
a first solid electrode disposed on said substrate;
a second electrode broken into subsections, said subsections connected by a bus line and separated from said first electrode by a dielectric medium, wherein said subsections form diamonds with internal islands, wherein the diamonds are connected to said bus line.

13. The capacitor of claim 12, wherein the second electrode comprises material selected from the group consisting of Tungsten, Platinum, Rhodium, Chrome, Titanium/Tungsten and Nickel composites.

14. The capacitor of claim 12, wherein material for said dielectric medium is selected from the group consisting of tunable ferroelectric materials including barium-strontium titanate $Ba_xSr_{1-x}TiO_3$ (BST) and BST composites.

15. The capacitor of claim 12, wherein material for said substrate is selected from the group consisting of Alumina ($Al_2O_3$), Aluminum Nitride (AlN), Titania ($TiO_2$), glass-ceramic composites.

16. The capacitor of claim 12, wherein the internal islands are connected to said bus line.

17. The capacitor of claim 12, wherein the bus line is connected with the polygonal, triangle, quadrilateral and nonagon shapes and the internal islands of the second electrode to form at least two capacitors in series.

18. The capacitor of claim 12, wherein the bus line is connected with the polygonal, triangle, quadrilateral and nonagon shapes and the internal islands of the second electrode to form capacitors in series without capacitors in parallel.

19. The capacitor of claim 12, wherein the subsections cover a substantial portion of the dielectric medium.

20. The capacitor of claim 12, wherein the first electrode is positioned directly on the substrate.

* * * * *